(12) United States Patent
Fukumura et al.

(10) Patent No.: US 10,391,482 B2
(45) Date of Patent: Aug. 27, 2019

(54) TRANSPARENT PHOTOCATALYST COATING AND METHODS OF MANUFACTURING THE SAME

(71) Applicant: Nitto Denko Corporation, Osaka (JP)

(72) Inventors: Takuya Fukumura, Osaka (JP); Guang Pan, Oceanside, CA (US); Ekambaram Sambandan, Oceanside, CA (US); Rajesh Mukherjee, Oceanside, CA (US)

(73) Assignee: Nitto Denko Corporation, Osaka (JP)

( * ) Notice: Subject to any disclaimer, the term of this patent is extended or adjusted under 35 U.S.C. 154(b) by 585 days.

(21) Appl. No.: 14/903,019

(22) PCT Filed: Jul. 3, 2014

(86) PCT No.: PCT/US2014/045413
§ 371 (c)(1),
(2) Date: Jan. 5, 2016

(87) PCT Pub. No.: WO2015/003135
PCT Pub. Date: Jan. 8, 2015

(65) Prior Publication Data
US 2016/0151774 A1    Jun. 2, 2016

Related U.S. Application Data

(60) Provisional application No. 61/843,266, filed on Jul. 5, 2013.

(51) Int. Cl.
*B01J 37/34* (2006.01)
*C23C 14/06* (2006.01)
(Continued)

(52) U.S. Cl.
CPC ............ *B01J 37/34* (2013.01); *B01J 23/10* (2013.01); *B01J 23/14* (2013.01); *B01J 23/30* (2013.01); *B01J 23/72* (2013.01); *B01J 23/835* (2013.01); *B01J 35/004* (2013.01); *C23C 14/0688* (2013.01); *C23C 14/08* (2013.01)

(58) Field of Classification Search
None
See application file for complete search history.

(56) References Cited

U.S. PATENT DOCUMENTS 4,917,820 A    4/1990   Matsumoto et al.
4,955,208 A    9/1990   Kawashima et al.
(Continued)

FOREIGN PATENT DOCUMENTS

CN    101992096 A    3/2011
CN    102989444 A    3/2013
(Continued)

OTHER PUBLICATIONS

CN103137717A—English translation, Jun. 2013 (Year: 2013).*
(Continued)

*Primary Examiner* — Melvin C. Mayes
*Assistant Examiner* — Stefanie J Cohen
(74) *Attorney, Agent, or Firm* — K&L Gates LLP; Louis C. Cullman; Hal Gibson

(57) ABSTRACT

Methods for making photocatalyst compositions and elements exhibiting desired photocatalytic activity levels and transparency.

3 Claims, 3 Drawing Sheets

(51) Int. Cl.
*C23C 14/08* (2006.01)
*B01J 23/10* (2006.01)
*B01J 23/14* (2006.01)
*B01J 23/30* (2006.01)
*B01J 23/72* (2006.01)
*B01J 23/835* (2006.01)
*B01J 35/00* (2006.01)

(56) References Cited

U.S. PATENT DOCUMENTS

| | | | |
|---|---|---|---|
| 5,015,282 A | 5/1991 | Takahashi et al. | |
| 5,253,488 A | 10/1993 | Kim et al. | |
| 5,416,060 A | 5/1995 | Yamamoto et al. | |
| 6,103,363 A * | 8/2000 | Boire | C03C 17/002 428/325 |
| 6,730,630 B2 | 5/2004 | Okusako et al. | |
| 7,296,422 B2 | 11/2007 | Strohm et al. | |
| 7,947,318 B2 | 5/2011 | Tracy | |
| 8,293,171 B2 | 10/2012 | Haven | |
| 2002/0016250 A1 * | 2/2002 | Hayakawa | C03C 17/23 502/5 |
| 2002/0077251 A1 | 6/2002 | Okusako et al. | |
| 2003/0050196 A1 | 3/2003 | Hirano et al. | |
| 2005/0129589 A1 | 6/2005 | Wei et al. | |
| 2007/0082205 A1 | 4/2007 | Anzaki et al. | |
| 2007/0264494 A1 | 11/2007 | Krisko et al. | |
| 2008/0254975 A1 | 10/2008 | Kitazaki | |
| 2009/0286673 A1 | 11/2009 | Omoshiki | |
| 2010/0015193 A1 | 1/2010 | Inaoka et al. | |
| 2010/0113254 A1 | 5/2010 | Sato et al. | |
| 2011/0045964 A1 | 2/2011 | Abe et al. | |
| 2011/0082027 A1 | 4/2011 | Kitazaki | |
| 2011/0123694 A1 | 5/2011 | Ryska | |
| 2011/0143914 A1 | 6/2011 | Kitazaki | |
| 2012/0070334 A1 | 3/2012 | Ehrhorn | |
| 2012/0142521 A1 | 6/2012 | Kitazaki | |
| 2012/0198862 A1 | 8/2012 | Arrigo | |
| 2012/0257295 A1 * | 10/2012 | Kumagai | G02B 5/0858 359/884 |
| 2013/0180932 A1 | 7/2013 | Fukumura et al. | |
| 2014/0135209 A1 | 5/2014 | Kaburagi et al. | |

FOREIGN PATENT DOCUMENTS

| | | |
|---|---|---|
| CN | 102989456 A | 3/2013 |
| CN | 103137717 A * | 6/2013 |
| CN | 103137717 A | 6/2013 |
| EP | 0261422 | 3/1988 |
| EP | 0911078 | 4/1999 |
| EP | 0931581 | 7/1999 |
| EP | 1251884 | 7/2006 |
| EP | 2028947 | 12/2007 |
| EP | 2029483 | 12/2007 |
| EP | 2525173 | 11/2012 |
| EP | 2559744 | 2/2013 |
| JP | 10-066879 A | 3/1998 |
| JP | 11-092146 A | 4/1999 |
| JP | 2000-345320 A | 12/2000 |
| JP | 2001-205094 A | 7/2001 |
| JP | 2001-303274 A | 10/2001 |
| JP | 2002-028412 | 1/2002 |
| JP | 2002-284913 A | 10/2002 |
| JP | 2002292636 A | 10/2002 |
| JP | 2003-053194 | 2/2003 |
| JP | 2003-200058 A | 7/2003 |
| JP | 2004-086220 A | 3/2004 |
| JP | 2005-160494 | 6/2005 |
| JP | 2006-045073 A | 2/2006 |
| JP | 2006-089323 A | 4/2006 |
| JP | 2006-223939 | 8/2006 |
| JP | 2006-305563 | 11/2006 |
| JP | 2007-301988 A | 11/2007 |
| JP | 2010-099647 A | 5/2010 |
| JP | 2011-021581 A | 2/2011 |
| JP | 2011-212613 | 10/2011 |
| WO | 1990002572 | 3/1990 |
| WO | WO1990002572 | 3/1990 |
| WO | 1991009823 | 7/1991 |
| WO | WO1991009823 | 7/1991 |
| WO | 0156620 | 10/2002 |
| WO | 2004/108283 A1 | 12/2004 |
| WO | 2005/110599 A1 | 11/2005 |
| WO | 2008/047810 A1 | 4/2008 |
| WO | 2008/117655 A1 | 10/2008 |
| WO | 2007147743 | 3/2009 |
| WO | 2007147744 | 3/2009 |
| WO | 2012155907 | 11/2012 |
| WO | WO2012155907 | 11/2012 |
| WO | 2013/008718 A1 | 1/2013 |

OTHER PUBLICATIONS

F. Cirilli et al., "Influence of Cu overlayer on the properties of SnO2-based gas sensors," 315 Thin Solid Films 310 (1998).
Yaqi Hou et al., Photocatalytic Degradation Properties of Ag/TiO2 Composite Films Prepared by Magnetron Sputtering, 44(5) J. Tsinghua Univ. 589 (2004).
Office Action for Chinese Patent Application No. 201480038560.4 dated Jan. 29, 2018.
International Search Report of PCT/US2014/045413, filed on Jul. 3, 2014; dated ISR Feb. 9, 2015.
Chen, Liang, et al. "CeO2—WO3 Mixed Oxides for the Selective Catalytic Reduction of Nox by Nh3 Over a Wide temperature Range". Catal Lett 141:1859-1864 (2011).
Cui, Yumin et al., Photocatalytic Degradation of Bromophenol Blue by Wo3/CeO2, Journal of Henan University of Science and Technology: Natural Science, vol. 28, No. 3, published Jun. 30, 2007.
Dong, Liang et al., "Electrical Properties of Ce-Doped WO3 Thin Film", Journal of Southwest Jiaotong University, vol. 44, No. 6, pp. 963-967, published Dec. 15, 2009.
Ren, Yanyan, "Study on the Preparation of Sb, Ce Doped SnO2 Photoanode and Their Photoelectrocatalytic Activity for Degradation of Organic Matter in Water, China Master's Theses Full-Text Database", Engineering Science and Technology I, published Oct. 15, 2008.
Song, Kimei et al. "Preparation and Study on Photocatalytic Activities of Cu2O—WO3 Composites", Journal of Functional Materials, vol. 43, No. 1, published Jan. 15, 2012.
Chinese Office Action for CN 201480038560.4 dated May 4, 2017.
Chen, Liang, et al. "Ce02-W03 Mixed Oxides for the Selective Catalytic Reduction of Nox by Nh3 Over a Wide temperature Range". Catal Lett 141:1859-1864 (2011).
Japanese Notification of Reasons for Refusal dated Apr. 24, 2018 for Japanese Patent Application No. 2016-524373 filed on Apr. 20, 2018 (Original and English Translation Included).
European Office Action for European Application No. 14741772.9 dated Jul. 3, 2018 (5 pages).
Office Action dated Sep. 11, 2018 in Japanese App. No. 2016-524373.
Chinese Office Action dated Oct. 22, 2018 for Chinese Patent Application No. 201480038560.4.
Cai et al., Production Techniques for Ceramic Wall and Floor Tiles. Press of Wuhan University of Technology, pp. 452-453, Jul. 31, 2011 (English abstract provided and original).
Office Action for Chinese Patent Application No. 201480038560.4 dated Apr. 30, 2019 (Original in Chinese, and translation in English provided).

\* cited by examiner

FIG. 6
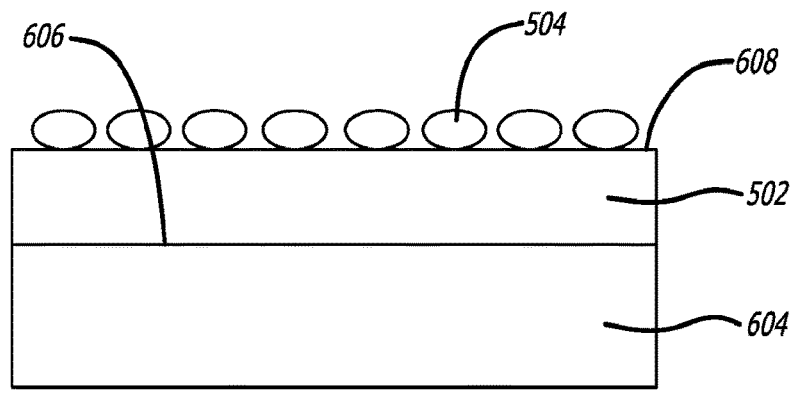
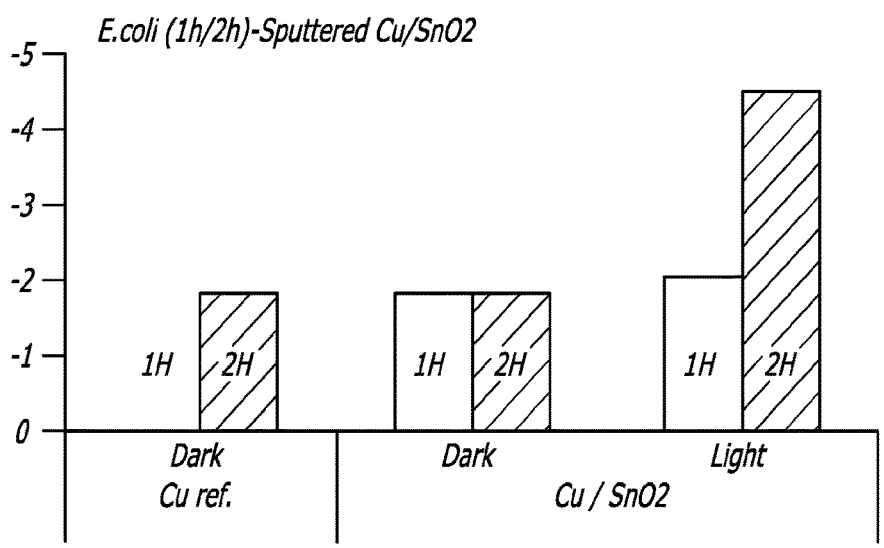
FIG. 7

TRANSPARENT PHOTOCATALYST COATING AND METHODS OF MANUFACTURING THE SAME

CROSS REFERENCE TO RELATED APPLICATIONS

This application is a national phase of PCT/US2014/045413 filed on Jul. 3, 2014 which claims priority to U.S. Application No. 61/843,266 filed on Jul. 5, 2013, the entire disclosures of which are incorporated by reference.

BACKGROUND

Visible-light activated photocatalysts can be deployed for self-cleaning, air, and water purification and many other interesting applications usually without any post-deployment non-renewable energy costs. This is because the photocatalysts are able to decompose pollutants (like dyes, volatile organic compounds, and $NO_x$) using available ambient light like solar radiation or indoor and outdoor lighting. With the anticipated rapid adoption of UV-free indoor lighting (like LEDs and OLEDs), it is important to find ways to deploy visible-light activated photocatalysts in indoor applications for instance in cleaning room air in domestic, public, and commercial spaces especially in confined spaces like aircraft, public buildings, etc. Moreover, additional applications for antibacterial surfaces and self-cleaning materials can have wide applicability in the food service, transportation, health care, and hospitality sectors.

Generally, photocatalytic coatings exhibit low photocatalytic activity, primarily due to low inherent activity of the base photocatalyst material as well as their incompatibility with the commonly used binders. Thus, there is a need for photocatalytic coatings and/or layers that exhibit desired photocatalytic levels and transparency.

SUMMARY

Photocatalytic compositions that include a photocatalyst, a non-photocatalyst, and/or a co-catalyst may be useful for a variety of photocatalytic applications. Additionally, a co-catalyst may improve the photocatalytic activity of a photocatalyst so that combination of a photocatalyst and a co-catalyst is more active than a photocatalyst alone. Furthermore, incorporation of photocatalytic material co-catalysts into photocatalytic coatings may help to improve the transparency and photocatalytic activity of the coating material.

Some embodiments include a method of manufacturing a coated article comprising: forming a thin layer of a photocatalytic composition by sputtering at least one photocatalytic source and at least one non-photocatalytic source onto a target material in a sputtering gas atmosphere.

Some embodiments include a coated article obtainable by a method described herein.

Some embodiments include a photocatalytic material comprising: a photocatalytic layer comprising tin and a non-photocatalytic material comprising copper, wherein part of the non-photocatalytic material is in direct contact with the photocatalytic layer. For some photocatalytic materials the photocatalytic layer and the non-photocatalytic material have a volume ratio that is about 1 to about 100 or about 3 to about 50.

In some embodiments, the photocatalyst can be Ti-based. In some embodiments, the photocatalyst can be responsive to visible light. In some embodiments, the photocatalyst can be titanium dioxide, a doped titanium oxide, or a composite titanium oxide material powder.

In some embodiments, the photocatalyst can be W-based. In some embodiments, the photocatalyst can be responsive to visible light. In some embodiments, the photocatalyst can be tungsten oxide, a doped tungsten oxide powder, or a tungsten oxide composite material powder.

In some embodiments, the photocatalyst can be Sn-based. In some embodiments, the photocatalyst can be responsive to visible light. In some embodiments, the photocatalyst can be tin oxide, a doped tin oxide powder, or a tin oxide composite material powder.

In some embodiments, the photocatalyst can any combination or mixture of Sn-based, W-based, and/or Ti based materials. In some embodiments, the photocatalyst can be responsive to visible light. In some embodiments, the photocatalyst can be a combination of at least one tin oxide, a doped tin oxide powder, or a tin oxide composite material powder. In some embodiments, the photocatalyst can be a combination of at least one tin oxide, a doped tin oxide powder or a tin oxide composite material powder and at least one of titanium dioxide, a doped titanium oxide, or a composite titanium oxide material powder. In some embodiments, the photocatalyst can be a combination of at least one tin oxide, a doped tin oxide powder or a tin oxide composite material powder, and at least one tungsten oxide, a doped tungsten oxide powder, or a tungsten oxide composite material powder. In some embodiments, the photocatalyst can be a combination of at least one of a tungsten oxide, a doped tungsten oxide powder, or a tungsten oxide composite material powder and at least one of titanium dioxide, a doped titanium oxide, or a composite titanium oxide material powder.

Some embodiments include a photocatalytic layer including the aforementioned photocatalytic composition. Some embodiments can further include a substrate, at least a portion of the photocatalytic material contacting the substrate.

Some embodiments include a transparent photocatalytic composition including at least one photocatalyst material and at least one metal and/or co-catalyst. In some embodiments, the photocatalyst material and the co-catalyst have refractive indices within about 0.75 of each other.

Some embodiments include a method of making a photocatalytic layer including forming the aforementioned compositions and applying the compositions to a substrate.

In some embodiments, a method of manufacturing a coated article is provided, the method comprising forming a thin layer of the photocatalytic composition on a substrate by sputtering at least one photocatalytic source and at least one non-photocatalytic source as target material in a sputtering gas atmosphere. In some embodiments, the thin layer is substantially uniform across the substrate surface. In some embodiments, the thin layer is substantially continuous across the substrate surface. In some embodiments, the at least one photocatalytic source and the at least one non-photocatalytic source are intimately combined in the resulting thin layer. In some embodiments, the molar ratio of photocatalyst to non-photocatalyst or metal is about 1:1 [50% to 50%]. In some embodiments, the molar ratio of photocatalyst to non-photocatalyst or metal can be about 4:1 [80% to 20%]. In some embodiments, the photocatalytic source comprises at least one tin source. In some embodiments, the at least one tin source is selected from $SnO_2$ and Sn metal. In some embodiments, the photocatalytic source comprises a tungsten source. In some embodiments, the tungsten source can be selected from $WO_3$ and W metal. In some embodiments, the non-photocatalytic source can comprise a metal. In some embodiments, the metal can be copper. In some embodiments, the photocatalyst is a tin oxide and the metal is copper. In some embodiments, the thin layer can comprise a first layer formed from the at least one tin source and a second layer formed from the at least one metal source. In some embodiments, at least one of or both the first layer and the second layer are substantially uniform and/or continuous across the substrate surface. In some embodiments, at least a portion of the first layer is in direct contact with at least a portion of the second layer. In some embodiments, substantially no layers or materials are located between the first and second layers. In some embodiments, the thin layer can comprise a co-sputtered layer formed from at least one tin source and the at least one metal source. In some embodiments, the co-sputtered layer is substantially uniform and/or continuous across the substrate surface. In some embodiments, the at least one tin source and the at least one metal source in the co-sputtered layer are intimately combined in the resulting co-sputtered layer. In some embodiments, the at least one non-photocatalytic source can comprise a co-catalytic source. In some embodiments, the at least one co-catalytic source can comprise $CeO_2$ and/or $In_2O_3$. In some embodiments, the sputtering gas atmosphere can comprise an inert gas. In some embodiments, the inert gas can be argon. In some embodiments, the sputtering gas atmosphere can comprise oxygen. In some embodiments, the thin layer can comprise a first layer formed from the at least one tungsten source and a second layer formed from the at least one co-catalyst source. In some embodiments, the thin layer can comprise a co-sputtered layer formed from at least one tungsten source and the at least one co-catalyst source. In some embodiments, the molar ratio of photocatalyst to $CeO_2$ is about 1:1 [50% to 50%]. In some embodiments, the molar ratio of photocatalyst to $CeO_2$ can be about 4:1 [80% to 20%]. In some embodiments, the substrate can be heated at a temperature between room temperature and 500° C. In some embodiments, the substrate can be heated for a time between about 10 seconds and about 2 hours. In some embodiments, a method of purifying air or water is provided, the method comprising exposing the air or water to light in the presence of a photocatalytic composition described herein. In some embodiments, the photocatalytic composition can remove greater than about 50% of the pollution in the air or water.

Some embodiments include a method of manufacturing a coated article including forming a thin layer of the photocatalytic composition on a substrate by sputtering at least one photocatalytic source and at least one metal or co-catalytic source as target material in a sputtering gas atmosphere. In some embodiments, the photocatalytic source is $SnO_2$ and/or tin (Sn) metal, $WO_3$ and/or tungsten (W) metal, and/or $TiO_2$ and/or titanium metal. In some embodiments, the metal source is Cu. In some embodiments, the co-catalytic source is $CeO_2$.

Some embodiments include a method for making a photocatalytic layer including creating a dispersion comprising a photocatalyst, $CeO_2$, and a dispersing media wherein the respective photocatalyst and $CeO_2$ refractive indices are within 0.75 of each other, the molar ratio of the photocatalyst to $CeO_2$ being between 1-99 molar % photocatalyst and 99-1 molar % $CeO_2$, wherein the dispersion has about 2-50 wt % solid materials. The dispersion is applied to a substrate and heated at a sufficient temperature and for a length of time to evaporate substantially all the dispersing media from the dispersion.

Some embodiments include a method of purifying air or water, the method comprising exposing the air or water to light in the presence of a photocatalytic composition described herein.

Some embodiments include a method of removing a pollutant, comprising exposing a material comprising the pollutant to light in the presence of a photocatalytic composition described herein.

These and other embodiments are described in more detail herein.

BRIEF DESCRIPTION OF THE DRAWINGS

FIG. 6 is a schematic depiction of an embodiment of a photocatalytic coated surface.

FIG. 7 is a graph depicting the antibacterial activity of an embodiment described herein.

DETAILED DESCRIPTION

Figure 1:
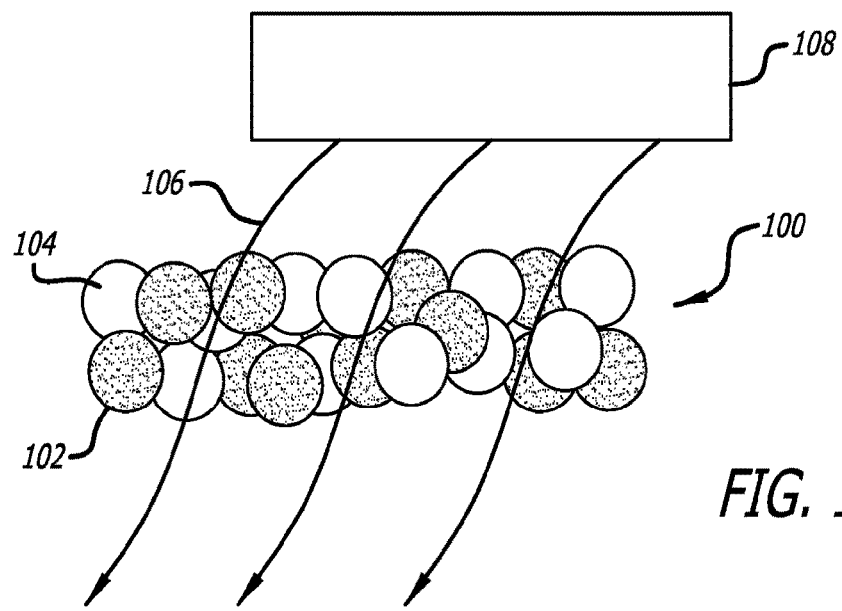
FIG. 1 is a schematic depiction of an embodiment of a photocatalytic coating.

A photocatalyst includes any material that can activate or change the rate of a chemical reaction as a result of exposure to light, such as ultraviolet or visible light. In some embodiments, photocatalyst material may be an inorganic solid, such as a solid inorganic semiconductor, that absorbs ultraviolet or visible light. For some materials, photocatalysis may be due to reactive species (able to perform reduction and oxidation) being formed on the surface of the photocatalyst from the electron-hole pairs generated in the bulk of the photocatalyst by the absorption of electromagnetic radiation. In some embodiments, the photocatalyst has a conduction band with an energy of about 1 eV to about 0 eV, about 0 eV to about −1 eV, or about −1 eV to about −2 eV, as compared to the normal hydrogen electrode. Some photocatalysts may have a valence band with energy of about 3 eV to about 3.5 eV, about 2.5 eV to about 3 eV, or about 2 eV to about 3.5 eV, or about 3.5 eV to about 5.0 eV as compared to the normal hydrogen electrode.

Traditionally, photocatalysts could be activated only by light in the UV regime—i.e., wavelengths less than 380 nm. This is because of the wide bandgap (>3 eV) of most semiconductors. However, in recent years by appropriately selecting materials or modifying existing photocatalysts, visible light photocatalysts have been synthesized (Asahi et al., Science, 293: 269-271, 2001 and Abe et al., Journal of the American Chemical Society, 130(25): 7780-7781, 2008). A visible light photocatalyst includes a photocatalyst that is activated by visible light, e.g. light that is normally visible to the unaided human eye, such as at least about 380 nm in wavelength. Visible light photocatalysts can also be activated by UV light below 380 nm in wavelengths in addition to visible wavelengths. Some visible light photocatalyst may have a band gap that corresponds to light in the visible range, such as a band gap greater than about 1.5 eV, less than about 3.5 eV, about 1.5 eV to about 3.5 eV, about 1.7 eV to about 3.3 eV, or 1.77 eV to 3.27 eV.

Some photocatalysts may have a band gap of about 1.2 eV to about 6.2 eV, about 1.2 eV to about 1.5 eV, or about 3.5 eV to about 6.2 eV.

Some photocatalysts include oxide semiconductors such as $TiO_2$, ZnO, $WO_3$, $SnO_2$, $In_2O_3$, etc., and modifications thereof. Contemplated modifications include doping and/or loading. Other materials, like complex oxides ($SrTiO_3$, $BiVO_4$) and some sulfides (CdS, ZnS), nitrides (GaN) and some oxynitrides (e.g. ZnO:GaN), may also display photocatalytic properties. Photocatalysts can be synthesized by those skilled in the art by a variety of methods including solid state reaction, combustion, solvothermal synthesis, flame pyrolysis, plasma synthesis, chemical vapor deposition, physical vapor deposition, ball milling, and high energy grinding.

In some embodiments, the photocatalyst can be an oxide semiconductor. In some embodiments, the photocatalyst can be a titanium (Ti) compound. In some embodiments, the photocatalyst can be a tungsten (W) compound. In some embodiments, the respective Ti or W compounds can be a respective oxide, oxycarbide, oxynitride, oxyhalide, halide, salt, doped or loaded compound. In some embodiments, the respective Ti or W compounds can be $TiO_2$, $WO_3$, or $Ti(O,C,N)_2$:Sn, such as $Ti(O,C,N)_2$:Sn wherein the molar ratio of Ti:Sn is about 90:10 to about 80:20, or about 87:13. In some embodiments, the respective Ti or W compounds can be nanopowders, nanoparticles, and or layers comprising the same. In some embodiments, the photocatalyst may include ZnO, $ZrO_2$, $SnO_2$, $CeO_2$, $SrTiO_3$, $BaTiO_3$, $In_2O_3$, $Cu_xO$, $Fe_2O_3$, ZnS, $Bi_2O_3$, or $BiVO_4$.

Any useful amount of photocatalyst may be used. In some embodiments, the photocatalyst material is at least about 0.01 molar % and less than 100 molar % of the composition. In some embodiments, the photocatalyst material is about 20 molar % to about 80 molar %, about 30 molar % to about 70 molar %, about 40 molar % to about 60 molar %, or about 50 molar % of the composition.

$SnO_2$, $TiO_2$, and $WO_3$ compounds, e.g., nanopowders, can be prepared by many different methods including thermal plasma (direct current and including radio frequency inductively-coupled plasma (RF-ICP)), solvothermal, solid state reaction, pyrolysis (spray and flame), and combustion. Radio frequency inductively-coupled plasma (e.g. thermal) methods as described in U.S. Pat. No. 8,003,563, which is incorporated herein in its entirety by reference, may be useful because of low contamination (no electrodes) and high production rates and facile application of precursors either in the gas, liquid, or solid form. Hence, radio frequency inductively-coupled plasma processes may be preferred. For example, when preparing $WO_3$ nanopowders, a liquid dispersion of ammonium metatungstate in water (5-20 wt % solid in water) can be sprayed into the plasma volume using a two-fluid atomizer. Preferably, the precursor can be present to about 20 wt % solid in water. The plasma can be operated at about 25 kW plate power with argon, nitrogen and/or oxygen gases. The particles formed from the condensed vapor from the plasma can then be collected on filters. In some embodiments, the particle surface areas range as measured using BET from about 1 $m^2/g$ to about 500 $m^2/g$, about 15 $m^2/g$ to 30 $m^2/g$, or about 20 $m^2/g$. In some embodiments, the obtained $WO_3$ may be heated from about 200° C. to about 700° C. or about 300° C. to about 500° C.

In some embodiments, a photocatalyst can be doped with at least one naturally occurring element, e.g. non-noble gas elements. Doped elements can be provided as precursors added generally during synthesis. Doped elements can be elements that are incorporated into the crystal lattice of the Ti or W compound, for example, as substituted within defined positions within the crystal lattice or otherwise interstitially included within the crystal. In some embodiments, the dopant can be selected from one or more elements including alkali metals including Li, Na, K, Cs; alkali earth metals including Mg, Ca, Sr, Ba; transition metals including Fe, Cu, Zn, V, Ti (for W-based compounds), W (for Ti-based compounds), Mo, Zr, Nb, Cr, Co, and Ni; lanthanide and actinide metals; halogens; Group III elements (from the Dmitri Mendeleev/Lothar Meyer style modern periodic table with elements arranged according to increasing atomic number) including B, Al, Ga, In and Tl, Group IV elements including Ca, Si, Ge, Sn; Group V elements including N, P, Bi; and Group VI elements including S and Se. For example, Indium Tin Oxide (ITO) can be considered $SnO_2$ doped with $In_2O_3$. In some embodiments, the photocatalyst can be doped with at least one element selected from C, N, S, F, Sn, Zn, Mn, Al, Se, Nb, Ni, Zr, Ce, and Fe. In some embodiments, the photocatalyst may be self-doped, e.g., $Ti^{3+}$ in place of $Ti^{4+}$ in a $TiO_2$ matrix. Details of suitably doped photocatalytic materials are presented in the U.S. Provisional Application No. 61/587,889, which is hereby incorporated by reference in its entirety.

In some embodiments, the photocatalytic material comprises one or more of n-type UV photocatalytic material, n-type visible light photocatalytic material, p-type UV photocatalytic material, and/or p-type visible photocatalytic material. In some embodiments, the n-type visible band gap semiconductors can optionally be $WO_3$, $Ti(O,C,N)_2$:Sn, or $CeO_2$. In some embodiments, the n-type UV photocatalytic material can optionally be $CeO_2$, $TiO_2$, $SnO_2$, $SrTiO_3$, $ATaO_3$, $ANbO_3$ etc.; A=alkali metal ion, such as A can Ca, Ba, and/or Sr. In some embodiments, p-type visible band gap semiconductors can optionally be SiC, $CuMO_2$, M=Al, Cr. In some embodiments, the p-type UV photocatalytic material can optionally be $ZnIrO_2$, $ZnRhO_2$, CuO, NiO, $Mn_2O_3$, $Co_3O_4$, and/or $Fe_2O_3$.

In some embodiments, the photocatalyst can be coated and/or loaded with at least one non-photocatalytic material. In some embodiments, the photocatalyst can be coated and/or loaded with at least one metal. Coated and/or loaded elements can be provided by post synthesis methodologies like impregnation (Liu, M., Qiu, X., Miyauchi, M., and Hashimoto, K., Cu(II) Oxide Amorphous NanoClusters Grafted $Ti^{3+}$ Self-Doped $TiO_2$: An Efficient Visible Light Photocatalyst. Chemistry of Materials, published online 2011), photoreduction (Abe et al., Journal of the American Chemical Society, 130(25): 7780-7781, 2008), and/or sputtering. In some embodiments, loading metals on photocatalysts may be carried out as described in U.S. Patent Publication Number 2008/0241542, which is incorporated herein in its entirety by reference. In some embodiments, the coated and/or loaded element is selected from noble elements. In some embodiments, the loaded element can be selected from at least one noble metal element, oxide, and/or hydroxide. In some embodiments, the noble metal elements include Au, Ag, Pt, Pd, Ir, Ru, Rh, or their oxides and/or hydroxides. In some embodiments, the coated and/or loaded element is selected from transition metals, their oxides and/or hydroxides. In some embodiments, the coated and/or loaded element is selected from Fe and Cu and Ni or their oxide and hydroxides. In some embodiments, the coated and/or loaded element is chosen from different groups of elements including at least one transition metal and at least one noble metal or their respective oxides and hydroxides.

According to some embodiments where a non-photocatalytic source material is included with a photocatalytic composition—whether as a layer separate from a layer comprising the photocatalytic composition, co-sputtered with the photocatalytic material, etc.—the non-photocatalytic source material contains substantially no titanium. And where the non-photocatalytic material comprises a separate layer, the separate layer contains substantially no titanium.

In some embodiments, the thin layer is substantially uniform across the substrate surface. In some embodiments, the thin layer is substantially continuous across the substrate surface. In some embodiments, the at least one photocatalytic source and the at least one non-photocatalytic source are intimately combined in the resulting thin layer. In some embodiments, at least one of or both the first layer and the second layer is substantially uniform and/or continuous across the substrate surface. In some embodiments, at least a portion of the first layer is in direct contact with at least a portion of the second layer. In some embodiments, no layers are located between the first and second layers. In some embodiments, the thin layer can comprise a co-sputtered layer formed from at least one tin source and the at least one metal source, such as copper. In some embodiments, the co-sputtered layer is substantially uniform and/or continuous across the substrate surface. In some embodiments, the at least one tin source and the at least one metal source in the co-sputtered layer are intimately combined in the resulting co-sputtered layer.

These co-sputtering methods may be used to prepare a photocatalytic material comprising a photocatalytic layer and a non-photocatalytic material, wherein part of the non-photocatalytic material is in direct contact with the photocatalytic material.

For example, the photocatalytic material may be in the form of a thin layer comprising a substantially continuous first layer formed from by sputtering a photocatalytic source and a second layer formed by sputtering a non-photocatalytic source. The second layer may be a continuous layer, or may be composed of particles or islands dispersed over the surface of the continuous first layer. The photocatalytic material may also comprise the non-photocatalytic material partially or completely embedded in the photocatalytic layer.

The first layer, or the photocatalytic layer, can have any suitable thickness, such as about 10 nm to about 200 nm, about 20 nm to about 200 nm, about 20 nm to about 100 nm, about 40 nm to about 60 nm, about 50 nm to about 55 nm, or any thickness in a range bounded by, or between, any of these values.

In some embodiments, the photocatalytic material comprises tin. For example the photocatalytic material could be an oxide of tin, such as $SnO_2$.

In some embodiments, the non-photocatalytic material comprises copper. For example, the non-photocatalytic material could be copper metal.

The photocatalytic layer and the non-photocatalytic material may have any suitable volume ratio. In some embodiments, the photocatalytic layer and the non-photocatalytic material may have a volume ratio (volume catalytic layer/volume non-catalytic material) that is about 1 to about 100, about 1 to about 50, about 3 to about 50, about 3 to about 20, about 5 to about 10, about 6 to about 8, or any ratio in a range bounded by, or between, any of these values.

In some embodiments where a non-photocatalytic source material or metal is co-sputtered or intimately mixed with a photocatalyst material, the non-photocatalytic source material or metal comprises more than about 5 molar % of the resulting thin layer. In some embodiments, the non-photocatalytic source material or metal comprises more than about 10 molar %, more than about 20 molar %, more than about 30 molar %, more than about 40 molar %, more than about 50 molar %, more than about 60 molar %, or more than about 70 molar %.

A co-catalyst includes a material that enhances the photocatalytic properties of a photocatalyst. Co-catalysts may also be generically referred to as T-binder throughout this document. In some embodiments, a co-catalyst may improve catalytic performance. For example a co-catalyst may increase a rate of catalysis by at least about 1.2, at least about 1.5, at least about 1.8, at least about 2, at least about 3, or at least about 5. One method of quantifying the rate of catalysis may include determining a rate of decomposition of an organic compound, such as acetaldehyde. For example, if the concentration of acetaldehyde were photocatalytically decreased to 80% of its original value after 1 hour, or by 20%, an increase in the rate of catalysis of about 2 would result in the amount of acetaldehyde being decreased to 60% of its original value after 1 hour, or by 40%. A rate of catalysis may be measured as a decrease in a compound such as acetaldehyde due to composition, at a given time point, such as about 0.5 hours, 1 hour, 1.5 hours, 2 hours, 2.5 hours, 3 hours, or 5 hours after the photocatalysis is initiated.

Some co-catalysts may be compounds or semiconductors that are capable of being reduced by electron transfer from the conduction band of the photocatalyst. For example, a co-catalyst may have a conduction band having a lower energy than the conduction band of the photocatalyst, or a co-catalyst may have a lowest unoccupied molecular orbital having a lower energy than the conduction band of the photocatalyst. When a term such as "lower energy" and "higher energy" is used to compare a band of a semiconductor or a molecular orbital with another band or molecular orbital, it means that an electron loses energy when it is transferred to the band or molecular orbital of lower energy, and an electron gains energy when it is transferred to the band or molecular orbital of higher energy.

It is believed that some metal oxides that are co-catalysts are capable of reducing $O_2$. For example, it is believed that $CeO_2$ can reduce $O_2$ gas by electron transfer. In doing so, it is believed that $Ce^{3+}$ transfers an electron to $O_2$ and is converted to $Ce^{4+}$ as a result. In a photocatalyst composition, a photocatalyst may transfer an electron to $CeO_2$, thus converting $Ce^{4+}$ to $Ce^{3+}$, and the $Ce^{3+}$ may then reduce $O_2$. $Ce^{3+}$ may also be present as a result of equilibrium processes involving $CeO_2$ and $O_2$, and superoxide radical ion ($O_2^-$). $O_2$ and superoxide radical ion in such an equilibrium process may be adsorbed to the surface of solid $CeO_2$ or present in the atmosphere. $Ce^{3+}$ may also be present as a result of oxidation and reduction reactions with cerium species of different oxidation states that may be added intentionally or present as impurities.

Some co-catalysts may be capable of converting atmospheric $O_2$ to superoxide radical ion. For example, $CeO_2$ is capable of converting atmospheric oxygen to superoxide radical ion. It is believed that some of the equilibrium and/or electron transfer processes described above may contribute to this property of $CeO_2$. Such a conversion may occur under a variety of conditions, such as ambient conditions, including for example, normal atmospheric oxygen concentrations, such as molar concentrations of about 10% to about 30%, about 15% to about 25%, or about 20% oxygen; ambient temperature, such as about 0° C. to about 1000° C., about 0° C. to about 100° C., about 10° C. to about 50° C., or about 20° C. to about 30° C.; and pressure, such as about 0.5 to about 2 atm, about 0.8 atm to about 1.2 atm, or about 1 atm. Such a conversion may also occur under elevated or reduced temperature, pressure, or oxygen concentration. Other materials that may be capable of reducing $O_2$ or converting atmospheric $O_2$ to superoxide radical ion include various other materials such as $Ce_xZr_yO_2$ (where x:y=0.99-0.01), $BaYMn_2O_{5+\delta}$, and lanthanide-doped $CeO_2$ including $Ce_xZr_yLa_zO_2$, $Ce_xZr_yPr_zO_2$, and $Ce_xSm_yO_2$.

Some co-catalysts may have a valence band or a highest occupied molecular orbital at a higher energy than a valence band of the photocatalyst. This may allow a hole in a valence band of the photocatalyst to be transferred to a highest occupied molecular orbital or a valence band of the co-catalyst. The hole in the valence band or highest occupied molecular orbital of co-catalyst may then oxidize $H_2O$ or $OH^-$ to $OH^-$. For example, if $WO_3$ is chosen as a photocatalyst, examples of suitable co-catalysts include anatase $TiO_2$, $SrTiO_3$, $KTaO_3$, SiC, or $KNbO_3$.

In some embodiments, the co-catalyst is inorganic. In some embodiments, the inorganic co-catalyst is a binder. In some embodiments, the co-catalyst is an oxide, such as a metal dioxide, including $CeO_2$, $TiO_2$, or the like.

In some embodiments, the co-catalyst comprises CuO, $MoO_3$, $Mn_2O_3$, $Y_2O_3$, $Gd_2O_3$, $TiO_2$, $SrTiO_3$, $KTaO_3$, SiC, $KNbO_3$, $SiO_2$, $SnO_2$, $Al_2O_3$, $ZrO_2$, $Fe_2O_3$, $Fe_3O_4$, NiO, $Nb_2O_5$, $In_2O_5$, $Ta_2O_5$, or $CeO_2$. In some embodiments, the co-catalyst comprises $In_2O_5$, $Ta_2O_5$, anatase $TiO_2$, rutile $TiO_2$, a combination of anatase and rutile $TiO_2$, or $CeO_2$.

In some embodiments, the co-catalyst can be $Re_rE_tO_s$, wherein in Re is a rare earth element, E is an element or a combination of elements, and O is oxygen, and $1 \le r \le 2$, $2 \le s \le 3$, and $0 \le t \le 3$. In some embodiments, the co-catalyst can be $Re_rO_s$ where Re can be a rare earth metal and r can be greater than or equal to 1 and less than or equal to 2, or can be between 1 and 2 and s can be greater than or equal to 2 and less than or equal to 3 or can be between 2 and 3. Examples of suitable rare earth elements include scandium, yttrium and the lanthanide and actinide series elements. Lanthanide elements include elements with atomic numbers 57 through 71. Actinide elements include elements with atomic numbers 89 through 103. In some embodiments, the co-catalyst can be $Ce_xZr_yO_2$ wherein the y/x ratio=0.001 to 0.999. In some embodiments, the co-catalyst can be cerium. In some embodiments, the co-catalyst can be $CeO_a$ ($a \le 2$). In some embodiments, the co-catalyst can be cerium oxide ($CeO_2$).

In some embodiments, the co-catalyst is $CeO_2$ doped with Sn, such as about 1 molar % to about 50 molar %, about 5 molar % to about 15 molar %, or about molar 10% Sn, based upon the total number of moles of co-catalyst.

In some embodiments, the photocatalyst is $WO_3$ and the co-catalyst is $CeO_a$ ($a \le 2$).

In some embodiments, the co-catalyst is a Keggin unit, e.g., ammonium phosphomolybdate (($NH_4)_3[PMo_{12}O_{40}]$), 12-phosphotungstic acid, silicotungstic acid, or phosphomolybdic acid. The overall stability of the Keggin unit allows the metals in the anion to be readily reduced. Depending on the solvent, acidity of the solution and the charge on the α-Keggin anion, it can be reversibly reduced in one- or multiple electron step.

In some embodiments, the photocatalytic layer is formed of the materials described herein.

While not wanting to be limited by any particular theory, the inventors believe that $CeO_2$ may be useful in conjunction with tungsten oxide because of the relative band positions of these materials. Furthermore, it is noted that the index of refraction of $CeO_2$ is substantially the same as tungsten oxide, about 90% to about 110% compared to tungsten oxide. In some embodiments, the index of refraction is about 95% to about 105% compared to tungsten oxide. In some embodiments, the high transparency of the photocatalytic compositions provides a composition/layer/element of transparency greater than about 50%, 60%, 65%, and/or 70%. The low scattering losses due to matched refractive indices contributes directly to a transparent composition.

Any useful ratio of photocatalyst to co-catalyst may be used. In some embodiments, a photocatalytic composition has a molar ratio (photocatalyst:co-catalyst) of about 1:5 to about 5:1, about 1:3 to about 3:1, about 1:2 to about 2:1, or about 1:1.

In some embodiments, a composition comprises tungsten oxide and a rare earth oxide at a molar ratio of about 0.5:1 to 2:1 or about 1:1 (tungsten oxide:rare earth oxide). In some embodiments, the rare earth oxide is cerium oxide ($CeO_2$). In some embodiments, the photocatalytic composition includes $WO_3$ and $CeO_2$, having a molar ratio ($WO_3:CeO_2$) of about 1:5 to about 5:1, about 1:3 to about 3:1, about 1:2 to about 2:1, or about 1:1.

FIG. 1 is a schematic representation of the structure of some embodiments according to the present disclosure. A transparent photocatalytic composition 100 is formed of a photocatalyst material 102 and a co-catalyst 104. Light waves 106 are emitted from a source 108 external to transparent photocatalytic composition 100 in a direction through it. In some embodiments, a photocatalytic element is provided, the element comprising transparent photocatalytic composition 100. In some embodiments, the element is a layer. In some embodiments, the element is a coating disposed over a substrate, In some embodiments, source 108 may comprise a photoluminescent material (phosphorescent or fluorescent), an incandescent material, an electro- or chemo- or sono- or mechano- or thermo-luminescent material. Suitable phosphorescent materials include ZnS and aluminum silicate whereas fluorescent materials include phosphors like YAG-Ce, $Y_2O_3$—Eu, various organic dyes etc. Incandescent materials include carbon, tungsten while electroluminescent materials include ZnS, InP, GaN, etc. It will be evident to one of ordinary skill in the art that any other kind of light generation mechanism would suffice for providing the energy to initiate photocatalysis, e.g., sunlight, fluorescent lamp, incandescent lamp, light-emitting diode (LED) based lighting, sodium vapor lamp, halogen lamp, mercury vapor lamp, noble gas discharges, and flames.

Figure 2:
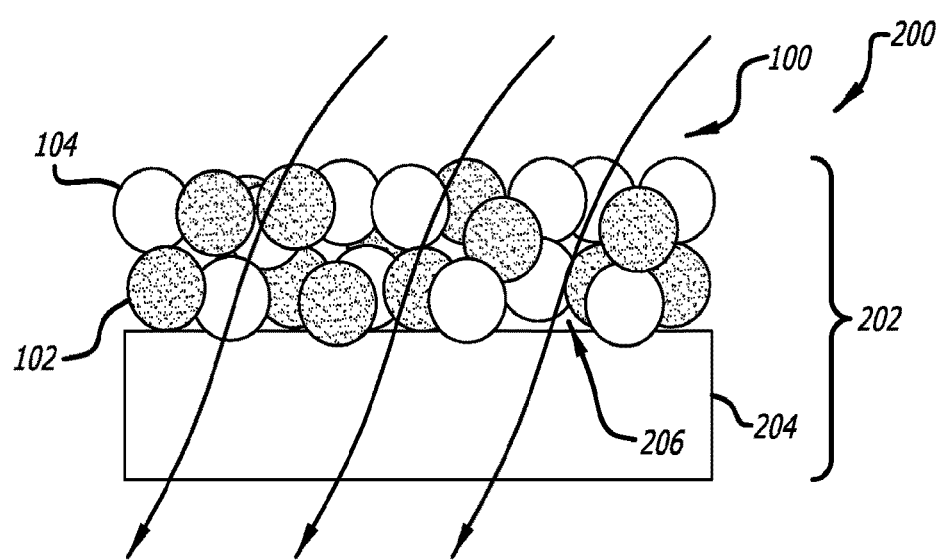
FIG. 2 is a schematic depiction of an embodiment of a photocatalytic coated surface.

FIG. 2 is a schematic representation of a system 200, which is characteristic of some embodiments disclosed herein. In some embodiments, a transparent photocatalytic element 202 is provided including a substrate 204 and transparent photocatalytic composition 100, the composition including at least one photocatalyst material 102 and co-catalyst 104 contacting at least a portion of substrate 204. In some embodiments, transparent photocatalytic composition 100 is applied to or disposed upon substrate 204, at least a portion of transparent photocatalytic composition 100 contacting surface 206 of substrate 204 or a portion thereof. In some embodiments, photocatalyst material 102 and co-catalyst 104 have refractive indices within about 0.75, about 0.50, about 0.20, or about 0.05 of each other. For example, in some embodiments, where the photocatalyst material 102 is $WO_3$ and co-catalyst 104 is $CeO_2$, the respective refractive indices are 2.20 and 2.36.

In some embodiments, the photocatalytic composition is coated to a substrate in such a way that the photocatalyst composition comes into contact with light and material to be decomposed.

By being disposed upon the substrate, the photocatalytic composition is a separately formed layer, formed prior to disposition upon the substrate. In some embodiments, photocatalytic composition 100 is formed upon the substrate surface, e.g., by sputtering; vapor deposition like either chemical vapor deposition (CVD) or physical vapor deposition (PVD); laminating, pressing, rolling, soaking, melting, gluing, spin coating; dip coating; bar coating; slot coating; brush coating; sputtering; thermal spraying including flame spray, plasma spray (DC or RF); high velocity oxy-fuel spray (HVOF) atomic layer deposition (ALD); cold spraying or aerosol deposition. In some embodiments, the photocatalytic composition is incorporated into the surface of the substrate, e.g., at least partially embedded within the surface.

Suitable deposition rates according to the present disclosure include rates between about 1 nm/min and about 100 nm/min, about 10 nm/min and about 50 nm/min, about 15 nm/min and about 30 nm/min, or about 20 nm/min.

Suitable deposition times according to the present disclosure include from about 1 minute to about 120 minutes, from about 1 minute to about 60 minutes, or from about 10 minutes to about 40 minutes.

Suitable thicknesses achieved according to the present disclosure of some or all of the layers that may be deposited depending on the specific embodiment in question may be between about 1 nm to about 100 nm, between about 5 nm and about 50 nm, or between about 10 nm and about 30 nm.

In some embodiments, the photocatalyst composition substantially covers the substrate 204. In some embodiments, the photocatalyst composition contacts or covers at least about 75%, at least about 85%, or at least about 95% of substrate surface 206.

A larger surface area may translate into higher photocatalytic activity. In some embodiments, the Brunner Emmett Teller BET specific surface area of the photocatalyst is between about 0.1 m$^2$/g and about 500 m$^2$/g. In some embodiments, the BET specific surface area of the photocatalyst is between about 10 m$^2$/g and about 50 m$^2$/g.

In some embodiments, a photocatalytic layer is provided including the aforementioned compositions of tungsten oxide to rare earth oxide.

Some embodiments comprise a method for making a photocatalytic composition including creating a dispersion comprising a $CeO_2$ photocatalyst and a dispersing media, wherein the respective photocatalyst and $CeO_2$ refractive indices are within at least 0.75 of each other, the molar ratio of the photocatalyst to $CeO_2$ being between about 1-99 molar % photocatalyst and about 99-1 molar % $CeO_2$; wherein the dispersion includes about 2-50 wt % solid materials; applying the dispersion to a substrate; and heating the dispersion and the substrate at a sufficient temperature and length of time to evaporate substantially all the dispersing media from the dispersion. In some embodiments, the dispersion is applied to cover the substrate, either in whole or in part, or is applied to a surface of the substrate to create a coating or surface layer.

Figure 3:
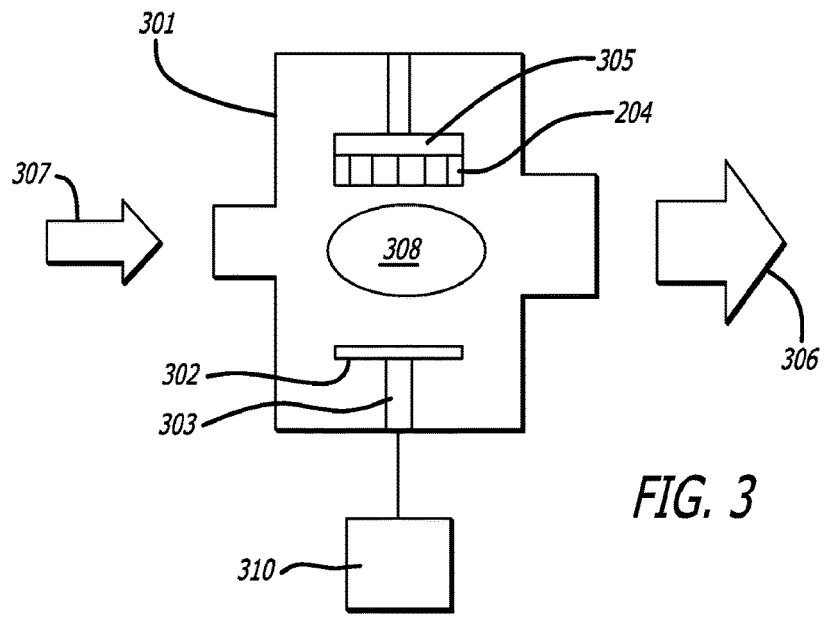
FIG. 3 is a schematic depiction of a sputtering apparatus for manufacturing a photocatalytic coated surface.

FIG. 3 is a schematic view showing a sputtering apparatus employed for depositing the transparent composition 100 on a surface or substrate. That is, while being connected with a cathode 303, a target 302 made of the photocatalytic material 102, such as $SnO_2$, Sn metal, $WO_3$, or W metal; or a metal, such as Cu, or co-catalyst 104, such as $CeO_2$, to be sputtered onto the substrate 204, is installed in the inside of a vacuum chamber 301. On the other hand, a substrate 204 to deposit the transparent composition 100 thereon can be installed on an anode 305 side.

At the time of film formation, chamber 301 is initially evacuated to be in a vacuum state by a vacuum gas discharge pump 306. In some embodiments, the term "vacuum state" refers to a low pressure of less than about 10 pascals, less than about 5 pascals, less than about 2 pascals, less than about 1 pascal, less than about 0.5 pascals, or less than about 0.4 pascals. In some embodiments, the term "vacuum state" refers to a low pressure of less than about $1 \times 10^{-2}$ torr, less than about $2 \times 10^{-3}$ torr, and even less than about $1 \times 10^{-3}$ torr. After achieving a vacuum state, discharge gases, e.g., argon (Ar) and/or oxygen ($O_2$), are introduced from a gas supply source 307. An electric field is applied between the anode 305 and the cathode 303 from an electric power source 310 to start plasma discharge 308. Subsequently, the surface of the target 302 is sputtered and the metal tungsten and oxygen are bonded on the substrate 204 to form a photocatalytic element 202. In this case, the electric power to be loaded from the electric power source 110 may be DC (direct current) power or RF (radio frequency) power.

In embodiments where RF power is used, the RF power is between about 100 W and about 1000 W, between about 300 W and about 700 W, or about 500 W.

In embodiments where DC power is used, the DC power is between about 0.1 kW and about 10 kW, between about 0.5 kW and about 5 kW, about 0.5 kW, or about 1 kW.

In some embodiments, a method of manufacturing an anti-bacterial coated article comprises forming a thin layer of any of the photocatalytic compositions described in the previously filed application Ser. No. 13/738,243, filed Jan. 10, 2013, e.g., embodiments of claims 1-47, on a substrate by sputtering at least one photocatalytic source and at least one metal and/or co-catalytic source as target material in an atmosphere of a sputtering gas.

In some embodiments, the photocatalytic source is at least one tungsten source. In some embodiments, the at least one tungsten source is $WO_3$ and/or W metal. In some embodiments, the photocatalytic source is at least one tin (Sn) source. In some embodiments, the at least one tin source is $SnO_2$ and/or Sn metal.

In some embodiments, the at least one co-catalyst source is any of the co-catalytic materials described elsewhere in this application. In some embodiments, the co-catalyst source is $CeO_2$.

In some embodiments, the at least one metal source is any of the metal materials described elsewhere in this application. In some embodiments, the metal source is Cu, CuO, and/or $Cu_2O$. In some embodiments, sputtering of the metal materials is performed under a substantially pure inert gas atmosphere. In some embodiments, the sputtering of the metal materials is performed under a mixture of an inert gas and oxygen. While not wanting to be limited by any particular theory, it is believed that varying the amount of $O_2$ gas in the metal sputtering atmosphere can allow for oxidizing the metal materials sputtered/created upon the target surface.

Figure 4:
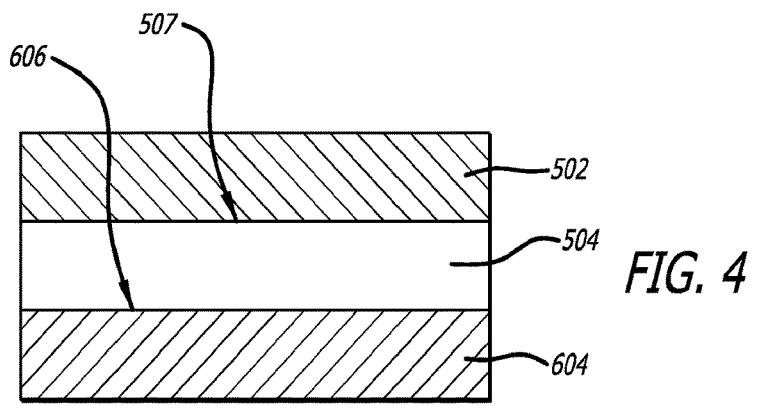
FIG. 4 is a schematic depiction of an embodiment of a photocatalytic coated surface.
Figure 5:
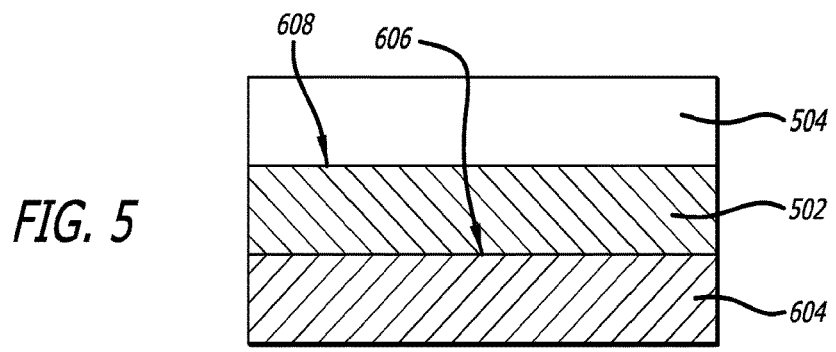
FIG. 5 is a schematic depiction of an embodiment of a photocatalytic coated surface.

In some embodiments, the sputtering gas atmosphere is an inert gas. While not wishing to be limited by any particular theory, it is believed that the atomic weight of the sputtering gas should be close to the atomic weight of the target material. In some embodiments, the sputtering gas is helium, argon, krypton, xenon, nitrogen, and/or oxygen. In some embodiments, the sputtering gas is argon. In some embodiments, the sputtering gas atmosphere further comprises a reactive gas. Reactive sputtering involves reacting a gas with the target material as it travels between the substrate and the target. In some embodiments, when the targeting source does not provide sufficient precursor elements to assemble the desired end-product, e.g., when the at least one tungsten source is W metal, the sputtering gas atmosphere further comprises a reactive gas. In some embodiments, the reactive gas is an oxide, a nitride and/or a sulfide. In some embodiments, the reactive gas is an oxide or oxygen source, e.g., $O_2$ gas. In some embodiments, the sputtering gas atmosphere comprising $O_2$ gas is between about 1% to about 100% $O_2$ and the argon gas is between about 99% to about 0%. In some embodiments, the sputtering gas is provided at a gas pressure of at least about 10 standard cubic centimeters per minute (sccm). In some embodiments, the sputtering gas (or each sputtering gas if a mixture of sputtering gases is used) is provided at about 1, about 2, about 4, about 8, about 10, about 20, about 80 sccm, about 90 sccm, and/or about 100 sccm As shown in FIGS. 4 and 5, a photocatalytic element of some embodiments comprises a first layer 502 comprising a photocatalytic material, e.g., tungsten, and a second layer 504 comprising co-catalyst, e.g., $CeO_2$. In some embodiments, the layer 502 comprising a photocatalytic composition is separate from layer 504 comprising the co-catalyst. In some embodiments, the thin layer comprises a first layer formed from the at least one tungsten source and a second layer formed from the at least one co-catalyst source.

As shown in FIG. 2, transparent composition 100 according to some embodiments comprises a co-sputtered layer. The co-sputtered layer comprises both co-catalyst 104 and photocatalytic material 102. In some embodiments, co-catalyst 104, e.g., $CeO_2$, and photocatalytic material 102, e.g., a tungsten material, is co-sputtered onto substrate 204. In some embodiments, the co-sputtered layer comprises an increasing or decreasing concentration gradient of the co-sputtered materials.

As shown in FIG. 4, a second layer 504 of some embodiments comprising the co-catalyst, e.g., $CeO_2$, is disposed, contacted with and/or sputtered onto a surface 606 of a substrate 604. In some embodiments, the first layer 502 comprising the photocatalytic material, e.g., tungsten, is disposed upon and/or atop, contacted with and/or sputtered onto a surface 507 of a second layer 504. In some embodiments, second layer 504 is disposed between and/or interposed between first layer 502 and substrate 604.

As shown in FIG. 5, the first layer 502 of some embodiments comprising the photocatalytic material, e.g., comprising tungsten, can be disposed, contacted with and/or sputtered onto a surface 606 of the substrate 604. In some embodiments, the second layer 504 comprising the co-catalyst is disposed upon and/or atop, contacted with and/or sputtered onto surface 608 of first layer 502. In some embodiments, first layer 502 is disposed between and/or interposed between second layer 504 and substrate 604.

As shown in FIG. 6, first layer 502 of some embodiments comprising the photocatalytic material, e.g., comprising tin and/or tin oxide, is disposed, contacted with and/or sputtered onto surface 606 of substrate 604. In some embodiments, second layer 504 comprising the metal, e.g., copper, is disposed upon and/or atop, contacted with and/or sputtered onto surface 608 of first layer 502. In some embodiments, first layer 502 is disposed between and/or interposed between second layer 504 and substrate 604. In some embodiments, second layer 504 is a discontinuous layer defining apertures or voids between islands of material, e.g., Cu.

As it will be described later, in such a sputtering apparatus, a photocatalytic film with a predetermined film quality can be obtained by adjusting the electric power loaded for plasma discharge, the pressure and the composition of the ambient gas at the time of sputtering, and/or the temperature of the substrate.

In some embodiments, the temperature of the substrate can be between about room temperature ($T_r$) and about 800° C. In some embodiments, the substrate temperature can be between about 100° C. and about 500° C. In some embodiments, the substrate temperature can be, for example, about 250° C. and/or about 400° C.

In some embodiments, the sputtering is by the application of direct current (DC) to the sputtering apparatus. In some embodiments, the direct current applied to drive the sputtering is between about 100 V to about 500 V In some embodiments, the sputtering is performed by varying the sign between the electrodes at about 13.56 MHz (RF)

Some embodiments comprise a method for making a photocatalytic composition including mixing an aqueous dispersion of a visible light photocatalyst and $CeO_2$, the ratio of the photocatalyst to $CeO_2$ being between about 40-60 molar % photocatalyst and about 60-40 molar % $CeO_2$; adding sufficient dispersing media, e.g., water, to attain a dispersion of about 10-30 wt % solid materials; applying the dispersion to a substrate; and heating the substrate at a sufficient temperature and length of time to evaporate substantially all the water from the dispersion and the substrate. In some embodiments, the $CeO_2$ is a sol. In some embodiments, the photocatalyst material is added to the $CeO_2$ sol. In some embodiments, the $CeO_2$ is added to a photocatalyst dispersion. In some embodiments, both the photocatalyst dispersion and $CeO_2$ sol or dispersion are prepared separately and then mixed together to create the dispersion.

In some embodiments, the ratio of the photocatalyst to $CeO_2$ may be about 2:3 to about 3:2, such as between about 40-60 molar % photocatalyst and about 60-40 molar % $CeO_2$. In some embodiments, the ratio of photocatalyst to $CeO_2$ is about 1:1 [50 molar % to 50 molar %]. In some embodiments, the $CeO_2$ is a sol.

In some embodiments, the amount of dispersing media, e.g. water, added is sufficient to attain a dispersion of about 2-50 wt %, about 10-30 wt %, or about 15-25 wt % solid materials. In some embodiments, the amount of dispersing media, e.g., water, added is sufficient to attain a dispersion of about 20 wt % solid materials In some embodiments, the dispersion-covered substrate is heated at a sufficient temperature and/or sufficient length of time to substantially remove the dispersing media. In some embodiments at least about 90%, at least about 95%, at least about 99% of the dispersing media is removed. In some embodiments, the dispersion-covered substrate is heated at a temperature between about room temperature and about 500° C., between about 100° C. and about 400° C., or about 400° C. In some embodiments, the dispersion covered substrate is heated to a temperature between about 90° C. and about 150° C. In some embodiments, the dispersion covered substrate is heated to a temperature of about 120° C. In some embodiments, the substrate is heated by being irradiated by a lamp, such as a Xe lamp, where the power of the lamp may be between about 100 W and about 500 W, between about 200 W and about 400 W, or about 300 W.

While not wanting to be limited by any particular theory, it is believed that keeping the temperature below 500° C. may reduce the possibility of thermal deactivation of the photocatalytic material, for example due to photocatalytic material phase change to a less active phase (highly-active anatase $TiO_2$ to less active rutile), dopant diffusion, dopant inactivation, loaded material decomposition or coagulation (reduction in total active surface area).

In some embodiments, the dispersion-covered substrate is heated for a time between about 10 seconds and about 2 hours. In some embodiments, the dispersion-covered substrate is heated for a time of about 1 hour.

The dispersions described herein can be applied to virtually any substrate. Other methods of applying the dispersion to a substrate can include slot/dip/spin coating, brushing, rolling, soaking, melting, gluing, or spraying the dispersion on a substrate. A proper propellant can be used to spray a dispersion onto a substrate.

In some embodiments, the substrate need not be capable of transmitting light. For example, the substrate may be a common industrial or household surface on which a dispersion can be directly applied. Such substrates can include, glass (e.g., windows), walls (e.g., drywall), stone (e.g., granite counter tops), masonry (e.g., brick walls), metals (e.g. stainless steel), woods, plastics, other polymeric surfaces, ceramics, and the like. Dispersions in such embodiments can be formulated as paints, liquid adhesives on tape, coatings on wallpapers, drapes, lamp shades, light covers, tables, counter tops, and the like.

A photocatalyst composition may be capable of photocatalytically decomposing an organic compound, such as an aldehyde, including acetaldehyde formaldehyde, propionaldehyde, etc.; a hydrocarbon, such as an alkane, including methane, ethane, propane, butane, etc.; an aromatic hydrocarbon, such as benzene, naphthalene, anthracene, etc.; crude oil, or fraction thereof; dyes such as anthocyanins, methylene blue, basic blue 41; volatile organic compounds, such as methane, ethane, propane, butane, benzene, toluene, acetone, diethyl ether, methanol, ethanol, isopropyl alcohol, formaldehyde, ethyl acetate, xylene, etc.; $NO_x$, such as NO, $NO_2$, $N_2O$, HONO; $SO_N$, such as $SO_2$, $SO_3$, etc.; CO, $O_3$; etc., small organic molecules such as caffeine, diclofenac, ibuprofen, geosmin, flumequine, etc., bacteria such as *Escherichia coli, Staphylococcus aureus, Acinetobactor, Pseudomonas aeruginosa* etc., virus such as MS2, influenza, norovirus, etc., bacterial spores such as *Clostridium difficile*, protozoa such as *Giardia*, etc., and fungi such as *Candida*, etc. Photocatalytic decomposition may occur in a solid, liquid, or a gas phase.

To test the photocatalytic ability of a photocatalyst composition, gas-phase decomposition of acetaldehyde may be used. A photocatalyst sample is dispersed in water or other solvent including methanol or ethanol. A binder may be added to this dispersion in such a way as to produce a final dispersion with about 10-50% solid content. The dispersed sample can be homogenized using an ultrasonic probe. The dispersion can then be applied to a substrate. The substrate-applied dispersion combination can then be heated to about 120° C., thereby evaporating substantially all of the dispersant. Thereafter it can be subjected to high intensity UV illumination for about one hour for producing a pristine photocatalyst surface.

This photocatalyst composition/substrate can be placed in a Tedlar Bag (5 L) which can then be filled with about 3 L air from a compressed air source. Thereafter, acetaldehyde from a calibration-grade source can be added to achieve a final acetaldehyde concentration of about 80 ppm as measured using a calibrated gas chromatograph equipped with a high sensitivity flame ionization detector (GC-FID).

This gas bag sample can be equilibrated in the dark for about an hour and gas chromatography and flame ionization detection (GC-FID) can be used to confirm a stable concentration of acetaldehyde. A monochromatic blue light-emitting diode array (455 nm) with 200 mW/cm$^2$ intensity of illumination at the exposure plane can be then used to irradiate the bag. Gas samples can be collected from the bag using an automated system and analyzed using the GC-FID. Temporal variation of the concentration of acetaldehyde can be determined from the area under the corresponding peak of the chromatogram. Other suitable gas detection scheme like Gastec gas detection tubes may also be used for determining the acetaldehyde concentration in the bag.

The gas decomposition rate (%) can be set as a value calculated based on formula $[(X-Y)/X\cdot 100]$, where X represents a gas concentration before light irradiation and Y represents a gas concentration when the gas concentrations are measured.

In some embodiments, the acetaldehyde decomposition rate provided by the desired level of photocatalytic activity is at least about 10% in about 1 hour with above-mentioned illumination. In some embodiments, the decomposition rate is at least about 30% in about 1 hour. In some embodiments, the rate is 50% in about 1 hour. In some embodiments, the decomposition rate is at least about 80% in about 1 hour.

In some embodiments, a photocatalyst material contains the photocatalyst powder according to the embodiment whose content falls within a range of not less than 0.1 molar % nor more than 99 molar %. In some embodiments, a photocatalyst coating material contains the photocatalyst material according to the embodiment whose content falls within a range of not less than about 1 molar % nor more than about 90 molar %.

The photocatalyst material, compositions, and dispersions described herein can be used as a disinfectant, an odor eliminator, a pollutant eliminator, a self-cleaner, an antimicrobial agent and the like. The materials, compositions, and dispersions can be used to interact with air, liquid, microbial and/or solid substances. In some embodiments, they can be used to clean air such as in confined environments such as in aircraft fuselages or in more contaminated environments such as auto garages. In other embodiments, they can be used for antimicrobial properties such as to coat surfaces in need of disinfection such as food service or production facilities or hospitals or clinics.

In some embodiments, methods are utilized wherein polluted air is exposed to light and a photocatalyst material, composition, or dispersion as described herein thereby removing pollutants from the air.

In some embodiments, light and a photocatalyst material, composition, or dispersion can remove about 50%, about 60%, about 70%, about 80%, about 90%, about 95% or more of the pollution in the air.

In some embodiments, methods are utilized wherein polluted water is exposed to light and a photocatalyst material, composition, or dispersion as described herein thereby reducing the amount of contaminant in the water.

In some embodiments, light and a photocatalyst material, composition, or dispersion can remove about 50%, about 60%, about 70%, about 80%, about 90%, about 95% or more of the pollution from the water.

In some embodiments, methods are utilized wherein biological contaminants are exposed to light and a photocatalyst material, composition, or dispersion as described herein thereby disinfecting the biological material. In some embodiments, biological materials include food products.

In some embodiments, light and a photocatalyst material, composition, or dispersion can remove about 50%, about 60%, about 70%, about 80%, about 90%, about 95% or more of the contamination from the biological material in the air.

SAMPLE PREPARATION

All materials were used without further purification unless otherwise indicated.

Example 1A Manufacturing the Photocatalytic Element (Ex-1)

A tungsten metal disc (about 5 mm thick and about 6 inches in diameter) was provided as a tungsten source material and placed on a target platform (cathode side) within a vacuum chamber of a ULVAC SH-450 sputtering apparatus. A 10 mm×10 mm square of Quartz and Silicon wafer was placed on the anode side. After sealing the chamber, the vacuum was dropped to about $1\times10^{-3}$ Pa. The sputtering apparatus was provided with the following parameters: driving voltage about 500 W (RF), Ar gas (80 sccm), and $O_2$ gas (at about 20 sccm) were introduced into the vacuum chamber (maintained at about 4 pascals [Pa]) to achieve a deposition rate of about 20 nm/min. After completion of sputtering, the sputtered substrate was removed and annealed in an oven for about 60 minutes at about 400° C.

Example 1A-2

A substrate was sputtered in a manner similar to that described in Example 1A, except that the sputtering parameters were changed, e.g., Ar gas (4 sccm) and $O_2$ gas (at about 4 sccm) were introduced into the vacuum chamber (maintained at about 1 Pa).

Example 1B Manufacturing the Photocatalytic Element (Ex-2)

A tungsten metal disc was provided as a source material and placed on the target platform (cathode side) within the vacuum chamber of a ULVAC SH-450 sputtering apparatus. A 10 mm×10 mm square of Quartz and Silicon wafer was placed on the anode side. After sealing the chamber, the vacuum was dropped to about $1\times10^{-3}$ Pa. The sputtering apparatus was provided with the following parameters: driving voltage (DC) about 1 kW, Ar gas 20 sccm, and $O_2$ gas 20 sccm were introduced. Vacuum chamber pressure was maintained at about 2 Pa to achieve a deposition rate of about 20 nm/min. After completion of sputtering, the sputtered substrate was removed and annealed in an oven for about 60 minutes at about 400° C.

Example 1B-2

A substrate was sputtered in a manner similar to that described in Example 1B, except that the sputtering parameters were changed, e.g., Ar gas (80 sccm) and $O_2$ gas (at about 20 sccm) were introduced into the vacuum chamber (maintained at about 4 Pa) to encourage crystallization.

Example 1C

A mixture of $WO_3$ and $CeO_2$ (50 molar % of each) was provided as a source material and placed on the target platform (cathode side) within the vacuum chamber of a ULVAC SH-450 sputtering apparatus. A 10 mm×10 mm square of ITO coated glass was placed on the anode side. After sealing the chamber, the vacuum was dropped to about $1\times10^{-3}$ Pa. The sputtering apparatus was provided with the following parameters: driving RF power about 500 W, Ar gas 90 sccm, and $O_2$ gas 10 sccm were introduced. Vacuum chamber pressure was maintained at about 0.2 Pa. After completion of sputtering, the sputtered substrate was removed and annealed in an oven for about 60 minutes at about 400° C.

Example 1D

A 10 mm×10 mm square of Quartz was placed on the anode side within the vacuum chamber of a ULVAC SH-450 sputtering apparatus. Tin oxide ($SnO_2$) and copper (Cu) metal discs were provided as source material and placed, spaced apart from each other, on the target platform (cathode side). After sealing the chamber, the vacuum was dropped to about $1\times10^{-3}$ Pa. The respective $SnO_2$ and Cu discs were positioned relative the shuttering aperture/shuttering aperture closed so as not to be in a sputtering position, e.g., disposed opposite an opening communicating the anode and the cathode. The sputtering apparatus was provided with the following parameters for pre-sputtering or cleaning the target platform:driving voltage (DC) about 0.5 kW, Ar gas 20 sccm, and $O_2$ gas 20 sccm were introduced. Vacuum chamber pressure was maintained at about 0.34 Pa for about 10 min.

After the pre-sputtering, the shutter was opened/positioned so that the $SnO_2$ target disc was opposite the opening communicating the anode and cathode, and the sputtering apparatus was provided with the following parameters: driving voltage (RF) about 500 W, Ar gas 20 sccm, and $O_2$ gas 20 sccm were introduced. Vacuum chamber pressure was maintained at about 2 Pa to achieve a deposition rate of about 20 nm/min. $SnO_2$ deposition time was about 60 mins.

After $SnO_2$ sputtering and 10 min of pre-sputtering as described above (shutter closed/cathode isolated from anode), the shutter of the ULVAC SH-450 sputtering apparatus was positioned/opened so that the copper (Cu) metal disc/cathode was opposite the opening communicating between the anode and cathode. The $SnO_2$ sputtered 10 mm×10 mm square of Quartz and Silicon wafer was left on the anode side after completion of $SnO_2$ sputtering. The vacuum was stabilized at about 0.34 Pa. The sputtering apparatus was provided with the following parameters: driving voltage (DC) about 100 W, and Ar gas 20 sccm was introduced. Vacuum chamber pressure was maintained at about 0.46 Pa Cu deposition time was about 2 min. After completion of sputtering, the sputtered substrate was removed and annealed in an oven for about 60 minutes at about 400° C. The respective sputtered layer thicknesses of about 52 nm ($SnO_2$) and about 7 nm (Cu) were measured by using a scanning probe microscope (SPM)(Hitachi Nano Navi II/E-Sweep, Hitachi High-Tech Science Corporation, Japan). The deposed Cu appeared as a very thin layer or island structure (not fully covering the $SnO_2$ layer)

Comparative Example 1E

A sputtered quartz sample was prepared in a manner similar to Example 1D above, except that no $SnO_2$ sputtering was performed upon the quartz sample prior to Cu sputtering as described in Example 1D above. The sputtered layer thicknesses of about 7 nm (Cu) was measured by using a scanning probe microscope (SPM)(Hitachi Nano Navi II/E-Sweep, Hitachi High-Tech Science Corporation, Japan). The Cu appeared as a very thin layer or island structure (not fully covering the quartz substrate layer.

Example 4

A sputtered glass slide prepared in a manner similar to Examples 1D and 1E above, except that glass slides are substituted for the substrate placed on the anode side, is heated at about 120° C. on a hot plate under full spectrum irradiation by a Xe lamp (lamp power output about 300 W) for about 1 hour. Each slide is then sealed in a separate 5 L Tedlar bag under vacuum, followed by injecting about 3 L of ambient air and about 80 mL of 3500 ppm acetaldehyde. Each bag is then lightly massaged for about 2 minutes by hand then placed in the dark for about 15 min. The acetaldehyde concentration is then estimated by Gas Chromatography-Flame Ionization Detector (GC-FID) to be at 80±2 ppm. Each Tedlar bag containing a sample is placed back in the dark for about 1 hour. The slide/Tedlar bag is then exposed to array blue LED of 455 nm with light intensity of 50 mW/cm$^2$. A sample is collected every 30 minutes by an automated injection port of GC-FID and the amount of remaining acetaldehyde estimated at subsequent 30 minute intervals. It is anticipated that when a T-binder co-catalyst is combined with $WO_3$, performance will be at least comparable to bare $WO_3$.

Examples 5-7

5 g of $WO_3$ (Global Tungsten & Powder, Towanda, Pa., USA [GTP]) was added to high purity alumina ball mill jars containing about 50 g of $ZrO_2$ balls of about 3 mm in diameter and was ground by ball mill (SFM-1 model Desktop Planetary Ball Miller (MTI Corp. location) in 25 mL methanol for about 4 hours to obtain ground $WO_3$ (GTP) with a smaller particle size. Plasma-$WO_3$ was made in a manner similar to that described in U.S. Pat. No. 8,003,563, which is hereby incorporated by reference in its entirety.

Additional glass slides were made and placed in a Tedlar bag in a similar manner to that described in Example 4, except that 200 mg each of $WO_3$ (GTP) (Example 5 w/, Example 5a w/out), Ground $WO_3$ (GTP) (Example 6 w/, Example 6a w/out) and plasma-$WO_3$ (Example 7 w/, Example 7a w/out) each with and without $CeO_2$ were spin-coated on glass substrate instead of LPD-$WO_3$.

The spin-coated slides $WO_3$, Ground $WO_3$, find and plasma-$WO_3$ each with and without $CeO_2$ were prepared and were tested for acetylaldehyde degradation.

Example 8: Combination of Combustion Ti(O,C,N)$_2$:Sn and Plasma $CeO_2$ Towards Acetaldehyde Degradation In another example, Ti(O,C,N)$_2$:Sn was combined with plasma $CeO_2$ powder (1:1 mole ratio) in a similar manner to that described in a previous example, except that Ti(O,C,N)$_2$:Sn powder was used instead of $WO_3$ powder, and was spin coated on a glass micro slide as described in Example 1. The Ti(O,C,N)$_2$:Sn was synthesized as described in co-pending U.S. Patent Provisional Application Ser. No. 61/608,754, filed Mar. 8, 2012, which is hereby incorporated by reference in its entirety, by an aqueous combustion method employing glycine (1.4 g) as a completely decomposable fuel in addition to titanium (IV) bis ammonium lactate dihydroxide (7 mL of 50 wt % aqueous solution), tin octoate (0.883 g) and ammonium nitrate (3.5 g) at 300° C. followed by annealing at 400° C. for 30 min in the box furnace. A glass slide made in a manner similar to that of the previous examples was tested for acetaldehyde degradation as also earlier described (at 270 mW/cm$^2$ light intensity). 7% Acetaldehyde degradation was observed for the Ti(O,C,N)$_2$:Sn photocatalyst coated glass slide in a Tedlar bag. When, a glass slide with both Ti(O,C,N)$_2$:Sn and $CeO_2$ (1:1 mole ratio) was tested in a Tedlar bag, the acetaldehyde degradation increased to 22%.

Example 9 Photocatalytic Inactivation of E. coli (ATCC 8739)

A substrate (1"×2" glass slide) was prepared by sequential application of 70% IPA (Isopropyl Alcohol), 100% EtOH and then dried in air. Ex-1D and Comparative Example 1-E were sputtered as described in the Examples above to attain about 1 mg of the material on the substrate. The coated substrates were then placed in a glass dish with a water soaked filter paper for maintaining moisture. Glass spacers were inserted between the substrates and the filter paper to separate the substrates from the filter paper.

E. coli (ATCC 8739) was streaked onto a 5 cm diameter petri dish containing about 25 ml of LB agar, and was incubated at about 37° C. overnight. For each experiment, a single colony was picked to inoculate about 3 mL nutrient broth, and the inoculated culture was incubated at about 37° C. for about 16 hours to create an overnight culture (~$10^9$ cells/mL). A fresh log-phase culture of the overnight culture was obtained by diluting the overnight culture×100, inoculating another 5 cm petri dish with LB agar and then incubated at about 37° C. for about 2.5 hr. The fresh culture was diluted 50×, which gave a cell suspension of about 2×$10^6$ cells/mL. 50 uL of the cell suspension was pipetted onto each glass substrate. A sterilized (in 70% and then 100% EtOH) plastic film (20 mm×40 mm) was placed over the suspension to spread the suspension evenly under the film. At chosen time point, e.g., about 30 minute increments, the specimen was placed in 10 mL of 0.85% saline and vortexed at 3200 rpm for about 1 min to wash off the bacteria. The wash off suspension was serially diluted using 0.85% saline, and plated on LB agar and incubated at about 37° C. overnight to determine the number of viable cells in terms of CFU/Specimen. Counting was performed by visual inspection and the result multiplied by the dilution factor to arrive at the determined number. The specimen was then irradiated and positioned under a 1000 Lx fluorescent lamp. The results are shown in FIG. 7, wherein the Cu-only sputtered sample showed less than $10^{-2}$ reduction, sputtered Cu/$SnO_2$ showed about the same activity in dark, and sputtered Cu/$SnO_2$ sample showed at least $10^{-2}$ (about 4.3×$10^{-4}$ reduction) more reduction than either the Comparative Example 1-E or Example 1-D in the dark.

Example 38 Reducing Odor on an Airliner

A dispersion including a photocatalyst composition as described herein is provided as a coating on a thin adhesive film. This adhesive film is used to coat the ceiling of a Boeing 737. The photocatalyst composition can react with ambient light from light emitting diode light fixtures above the overhead bins to generate reactive airborne species that can reduce odor in the air.

Example 39: Disinfecting Food Preparation Surfaces

A photocatalyst resin capable of being applied as a spray is provided to a food preparation factory to coat its work surfaces. The resin can be applied in a heated or unheated state in order to properly bond with a work surface. All surfaces that are to come into contact with food in the factory are sprayed with the resin.

The factory is equipped with organic light emitting diode light fixtures for general lighting. This ambient light can react with the resin surface thereby creating oxygen radicals on the surface. These radicals can react with food contaminants thereby rendering the food safe. As a result of applying the resin to the work surfaces, instances of bacteria spreading into the food supply has reduced 50%.

Unless otherwise indicated, all numbers expressing quantities of ingredients, properties such as molecular weight, reaction conditions, and so forth used in the specification and claims are to be understood as being modified in all instances by the term "about." Accordingly, unless indicated to the contrary, the numerical parameters set forth in the specification and attached claims are approximations that may vary depending upon the desired properties sought to be obtained. At the very least, and not as an attempt to limit the application of the doctrine of equivalents to the scope of the claims, each numerical parameter should at least be construed in light of the number of reported significant digits and by applying ordinary rounding techniques.

The terms "a," "an," "the" and similar referents used in the context of describing the invention (especially in the context of the following claims) are to be construed to cover both the singular and the plural, unless otherwise indicated herein or clearly contradicted by context. All methods described herein can be performed in any suitable order unless otherwise indicated herein or otherwise clearly contradicted by context. The use of any and all examples, or exemplary language (e.g., "such as") provided herein is intended merely to better illuminate the invention and does not pose a limitation on the scope of any claim. No language in the specification should be construed as indicating any non-claimed element essential to the practice of the invention.

Groupings of alternative elements or embodiments disclosed herein are not to be construed as limitations. Each group member may be referred to and claimed individually or in any combination with other members of the group or other elements found herein. It is anticipated that one or more members of a group may be included in, or deleted from, a group for reasons of convenience and/or patentability. When any such inclusion or deletion occurs, the specification is deemed to contain the group as modified thus fulfilling the written description of all Markush groups used in the appended claims.

Certain embodiments are described herein, including the best mode known to the inventors for carrying out the invention. Of course, variations on these described embodiments will become apparent to those of ordinary skill in the art upon reading the foregoing description. The inventor expects skilled artisans to employ such variations as appropriate, and the inventors intend for the invention to be practiced otherwise than specifically described herein. Accordingly, the claims include all modifications and equivalents of the subject matter recited in the claims as permitted by applicable law. Moreover, any combination of the above-described elements in all possible variations thereof is contemplated unless otherwise indicated herein or otherwise clearly contradicted by context.

In closing, it is to be understood that the embodiments disclosed herein are illustrative of the principles of the claims. Other modifications that may be employed are within the scope of the claims. Thus, by way of example, but not of limitation, alternative embodiments may be utilized in accordance with the teachings herein. Accordingly, the claims are not limited to embodiments precisely as shown and described.

What is claimed is:

1. A photocatalytic material comprising a photocatalytic layer comprising tin, and a non-photocatalytic material comprising copper, wherein part of the non-photocatalytic material is in direct contact with the photocatalytic layer, and wherein the photocatalytic layer and the non-photocatalytic material have a volume ratio that is about 3 to about 50.

2. The photocatalytic material of claim 1, wherein the photocatalytic layer comprises $SnO_2$.

3. The photocatalytic material of claim 1, wherein the non-photocatalytic material comprises copper metal.

* * * * *